United States Patent
Goth et al.

(10) Patent No.: US 6,644,053 B2
(45) Date of Patent: Nov. 11, 2003

(54) METHOD FOR STARTING A REFRIGERATION UNIT

(75) Inventors: Gary F. Goth, Pleasant Valley, NY (US); Jody A. Hickey, Hyde Park, NY (US); Daniel J. Kearney, Ulster Park, NY (US); Robert Makowicki, Staatsburg, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/384,968

(22) Filed: Mar. 10, 2003

(65) Prior Publication Data
US 2003/0150224 A1 Aug. 14, 2003

Related U.S. Application Data

(62) Division of application No. 09/896,610, filed on Jun. 29, 2001, now Pat. No. 6,564,563.

(51) Int. Cl.⁷ .............................................. F25B 41/04
(52) U.S. Cl. ...................... 62/196.4; 62/228.4; 62/231
(58) Field of Search ...................... 62/196.4, 228.1, 62/228.4, 228.5, 277, 278, 157, 231, 226, 227, 275, 276; 165/80.2, 80.3, 80.4; 361/699, 700; 257/712, 713, 714, 715

(56) References Cited

U.S. PATENT DOCUMENTS

| | | | |
|---|---|---|---|
| 4,812,733 A | 3/1989 | Tobey | |
| 4,901,534 A | * 2/1990 | Nakatsuno et al. | .... 62/228.4 X |
| 5,349,823 A | 9/1994 | Solomon | |
| 5,482,113 A | 1/1996 | Agonafer et al. | |
| 5,606,264 A | 2/1997 | Licari et al. | |
| 5,780,928 A | 7/1998 | Rostoker et al. | |
| 5,970,731 A | 10/1999 | Hare et al. | |
| 6,012,291 A | 1/2000 | Ema | |
| 6,054,676 A | 4/2000 | Wall et al. | |
| 6,094,918 A | 8/2000 | Burbidge et al. | |
| 6,192,701 B1 | 2/2001 | Goth et al. | |
| 6,233,959 B1 | 5/2001 | Kang et al. | |
| 6,233,960 B1 | 5/2001 | Kang et al. | |
| 6,243,268 B1 | 6/2001 | Kang et al. | |
| 6,246,581 B1 | 6/2001 | Kang et al. | |

* cited by examiner

*Primary Examiner*—Harry B. Tanner
(74) *Attorney, Agent, or Firm*—Floyd A. Gonzalez; Cantor Colburn LLP

(57) ABSTRACT

A refrigeration system for cooling a logic module includes an evaporator housing including an evaporator block in thermal communication with the logic module. The evaporator housing includes a humidity sensor for detecting a humidity within the evaporator housing. The system further comprises a controller for controlling a refrigeration unit supplying cold refrigerant to the evaporator block in response to the operating conditions of the logic module and the temperature of the evaporator block. In another aspect of the invention, two modular refrigeration units are independently operable to cool the evaporator block, and each refrigeration unit is controllable in various modes of operation including an enabled mode in which it is ready to cool the evaporator and an on mode in which it is actively cooling the evaporator. In another aspect of the invention, the evaporator block and a heater on a reverse side of the circuit board are particularly controlled during concurrent repair operations. In another aspect of the invention, faulty sensors are recognized as such and an appropriate response is made. In another aspect of the invention, the system is shut down in a manner allowing rapid access to the logic module.

5 Claims, 7 Drawing Sheets

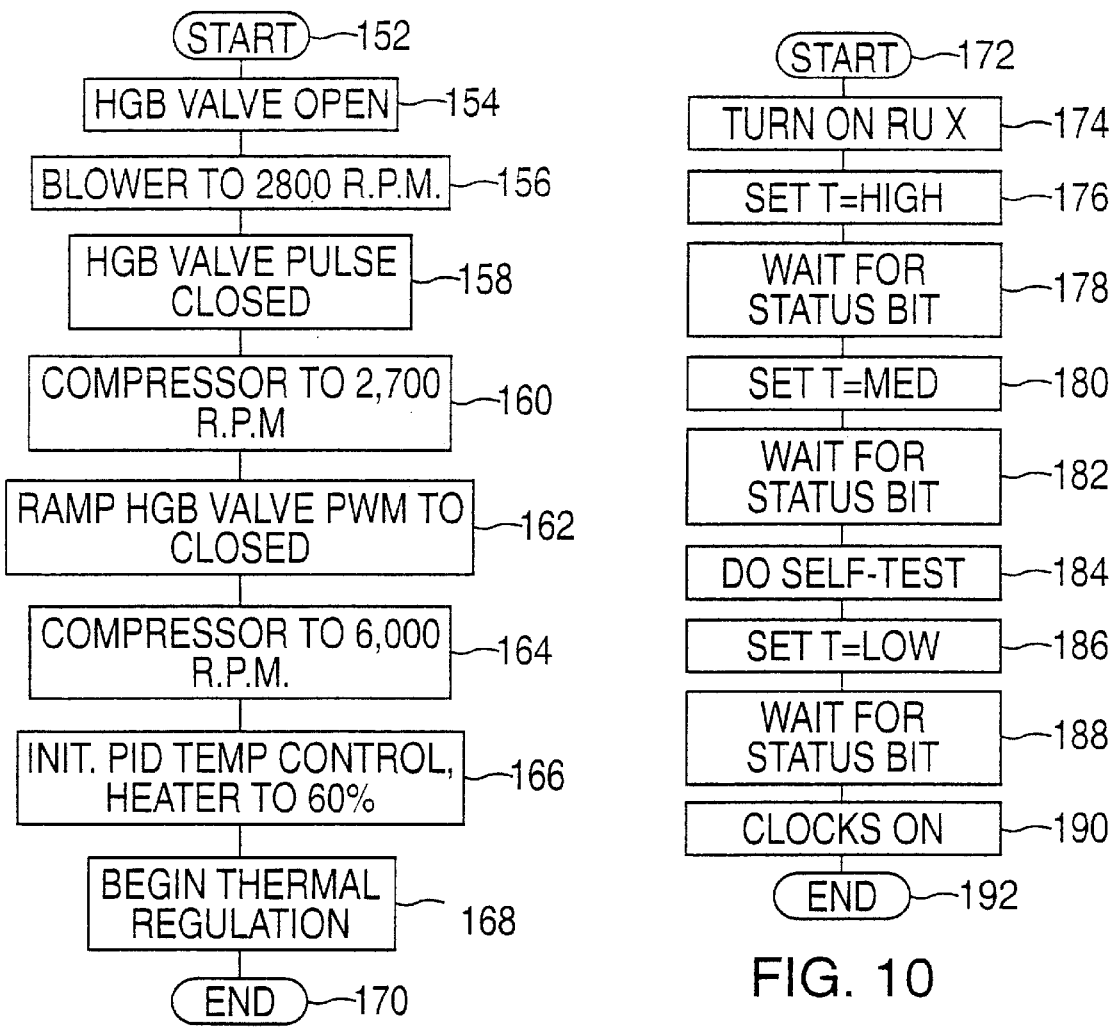
FIG. 9
FIG. 10
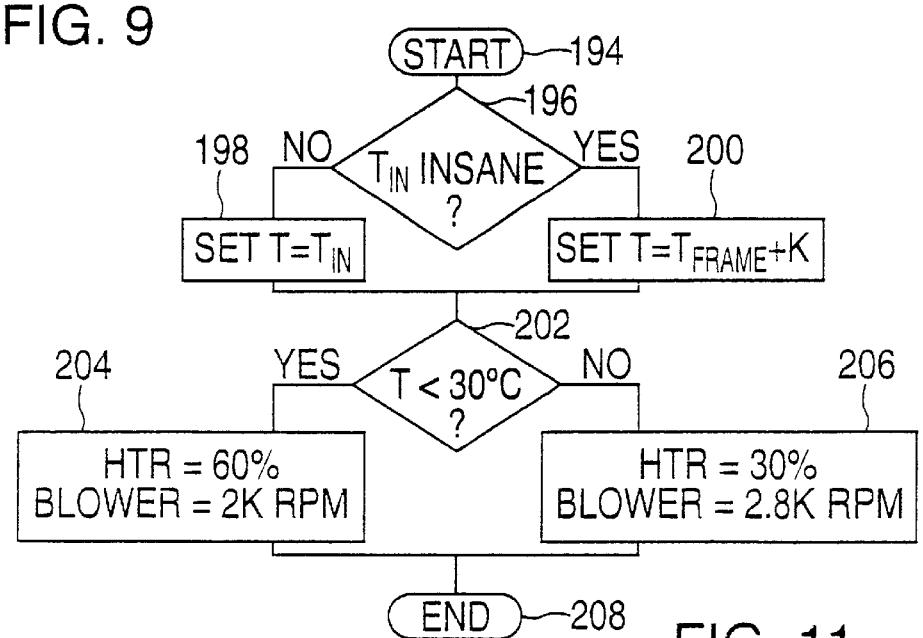
FIG. 11

METHOD FOR STARTING A REFRIGERATION UNIT

CROSS-REFERENCE TO RELATED APPLICATIONS

This application is a divisional of U.S. patent application Ser. No. 09/896,610 filed Jun. 29, 2001 now U.S. Pat. No. 6,564,563, the contents of which are incorporated by reference herein in their entirety.

BACKGROUND

The present invention relates to software for a cooling and condensation control system. In particular, the present invention relates to a cooling system and condensation control system for computer logic modules.

One of the factors that limit processing speed in computer systems is the generation of excessive heat at higher clock speeds. Significant gains of speed and reliability have been achieved by cooling computer logic modules down to temperatures below ambient. Unfortunately, cooling a logic module to below ambient temperatures can result in the formation of condensation, which is undesirable in a computer system.

Prior attempts at providing a cooling system for a computer module have not been satisfactory for higher-end computing applications. For example, one approach has been to remove moisture from incoming air cooled to 5° C. This approach requires handling a tremendous amount of water, and does not prevent condensation in an application where refrigerant may be operating as cold as −40° Celsius. Another approach has been to simply apply a fixed high-power heater around an evaporator unit which surrounds the logic module. In this way, the surface temperature of the logic module housing remains above the dew point. Another approach relies on enclosing the logic module in a vacuum enclosure as a means of providing effective insulation. Unfortunately, these approaches cannot adequately ensure that there will be no condensation in the evaporator housing and are therefore not sufficiently reliable.

Another problem unresolved by prior art cooling systems relates to condensation formed on the opposite side of the circuit board. This problem has limited the temperatures to which the logic module can be cooled to avoid condensation.

SUMMARY

The above discussed and other drawbacks and deficiencies of the prior art are overcome or alleviated by a refrigeration system including an evaporator housing including an evaporator block in thermal communication with the logic module. The evaporator housing includes a humidity sensor for detecting a humidity within the evaporator housing. The system further comprises a controller for controlling a refrigeration unit supplying cold refrigerant to the evaporator block in response to the operating conditions of the logic module and the temperature of the evaporator block. In another aspect of the invention, two modular refrigeration units are independently operable to cool the evaporator block, and each refrigeration unit is controllable in various modes of operation including an enabled mode in which it is ready to cool the evaporator and an on mode in which it is actively cooling the evaporator. In another aspect of the invention, the evaporator block and a heater on a reverse side of the circuit board are particularly controlled during concurrent repair operations. In another aspect of the invention, faulty sensors are recognized as such and an appropriate response is made. In another aspect of the invention, the system is shut down in a manner allowing rapid access to the logic module.

BRIEF DESCRIPTION OF THE DRAWINGS

The above-discussed and other features and advantages will be made known from the following detailed description and accompanying drawings, wherein like elements are numbered alike, and in which:

FIGS. 9, 10, and 11 show flow charts representing certain exemplary methods for operating or controlling a refrigeration system.

DETAILED DESCRIPTION

Figure 1:
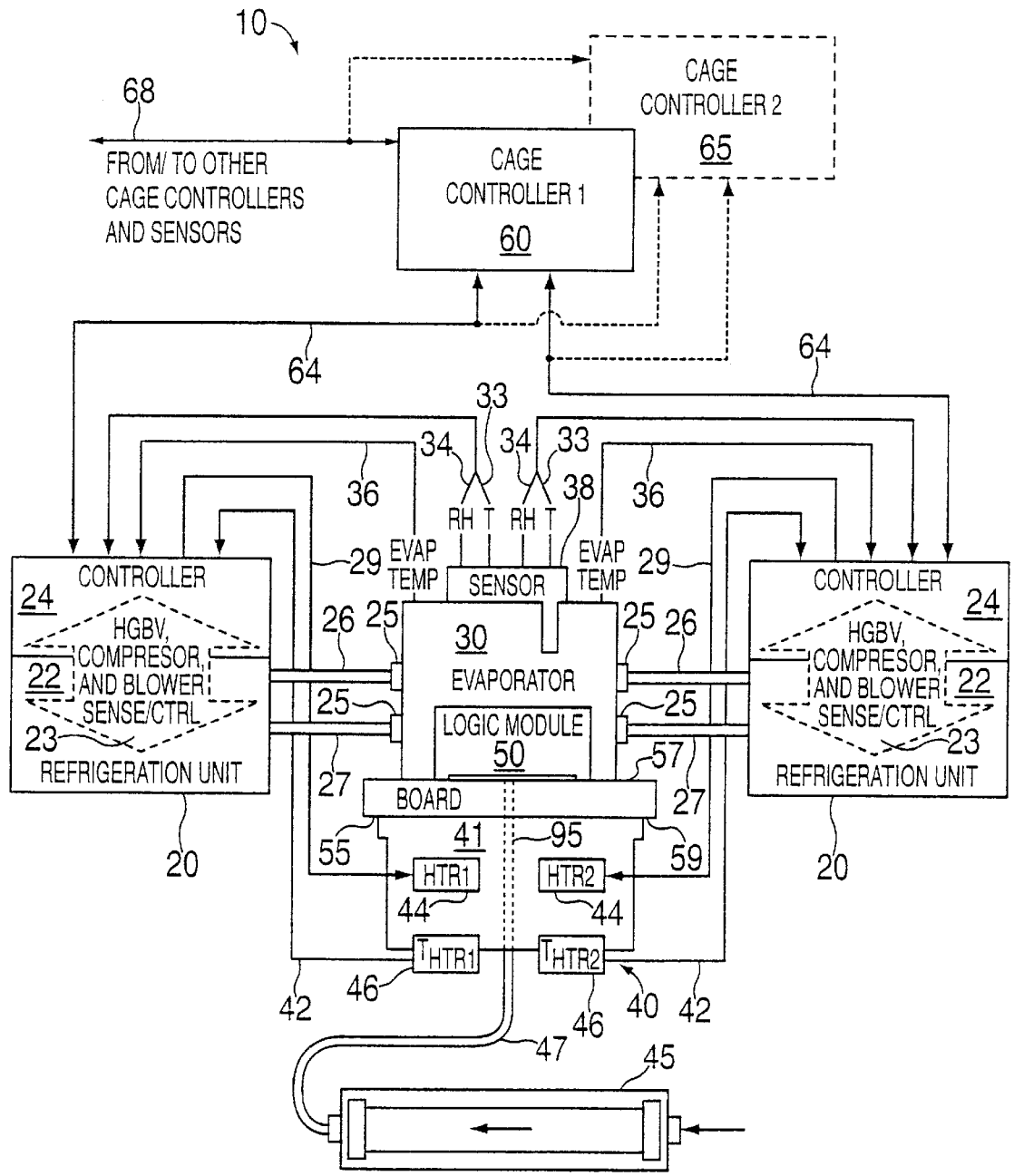
FIG. 1 is a schematic representation of an exemplary embodiment of the hardware components of a refrigeration system.

FIG. 1 is a schematic diagram providing an overview of the hardware components of exemplary refrigeration system 10. Refrigeration system 10 includes redundant refrigeration units 20 (two are shown) that sequentially or in unison provide coolant to evaporator 30 via refrigerant lines 26. Although the cooling system will be described with reference to two refrigeration units 20, it will be understood that the invention can be adapted for use with one or more such refrigeration units. Evaporator 30 is disposed over logic module 50 and is in thermal communication therewith for cooling logic module 50 to temperatures below ambient. Heat from logic module 50 is absorbed by coolant in evaporator 30. Coolant is then passed back to refrigeration units 20 where it is compressed, condensed, and expanded in any known refrigeration cycle.

Logic module 50 is preferably a multi-chip module, as are generally known in the art, but cooling system 10 is applicable to other concentrated heat generating devices that are advantageously maintained at below ambient temperatures. Logic module 50 is electrically and mechanically attached to a first side 58 of circuit board 55. Both logic module 50 and circuit board 55 are relatively flat structures having heights that are substantially less than their widths or lengths, and are shown in FIG. 1 in profile view (i.e., disposed perpendicular to the page). To prevent condensation on a second side 59 of circuit board 55 from forming, a heater 40 is disposed on second side 59 of circuit board 55. Heater 40 includes a heat spreader plate 41 in thermal communication with circuit board 55. Thermal pads 52 (FIG. 3) enhance thermal coupling between heat spreader plate 41 and plated through-hole connections (not shown) of circuit board 55, effectively warming circuit board 55. Heater 40 further includes redundant heat cartridges 44 to provide heat to heat spreader plate 41. Each heat cartridge 44 includes a resistive heat element (not shown) for converting electrical energy into heat energy. In a preferred embodiment, each heat cartridge is rated at 300 W. In addition to heat cartridges, other heat source types, such as flat resistive heaters, are contemplated.

Figure 6:
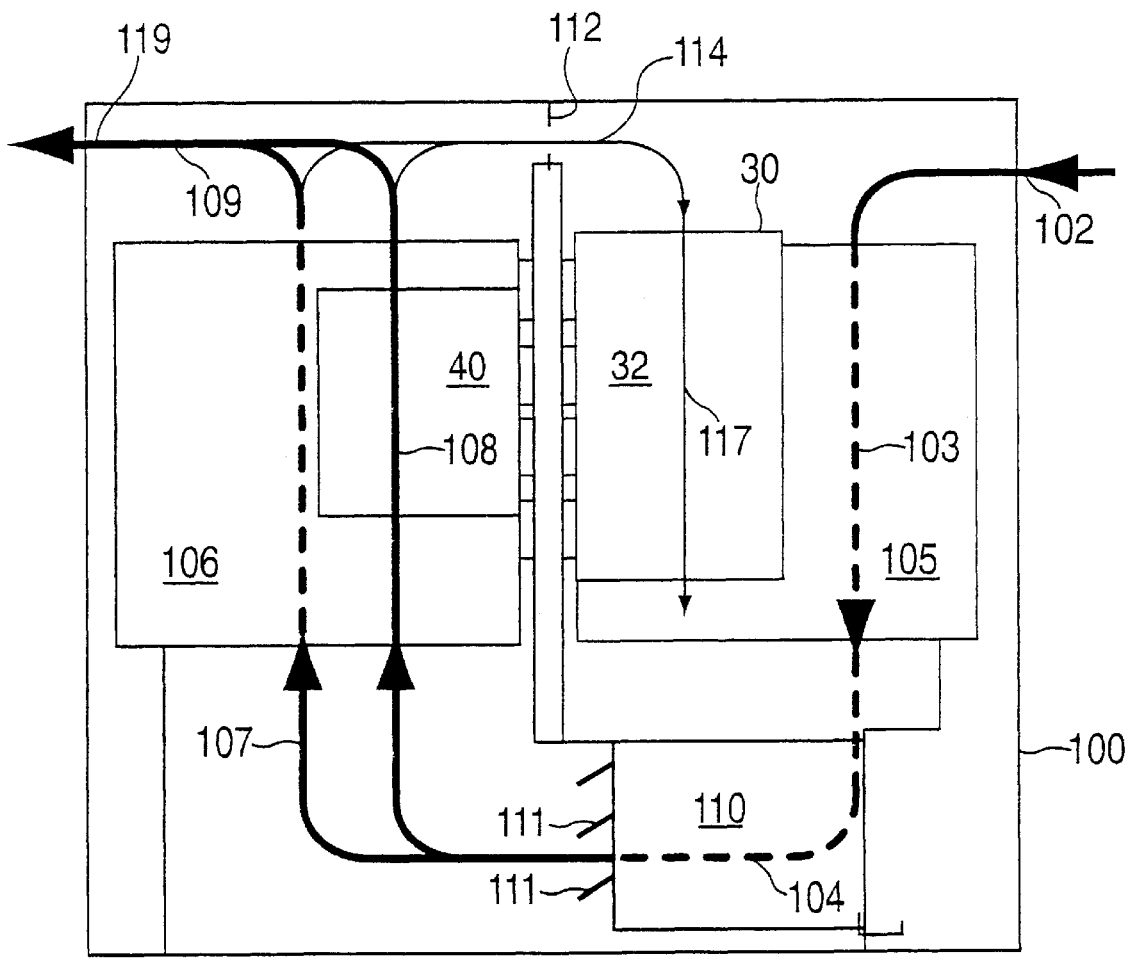
FIG. 6 is a schematic diagram depicting air flow management scheme in a processor cage.
Figure 7:
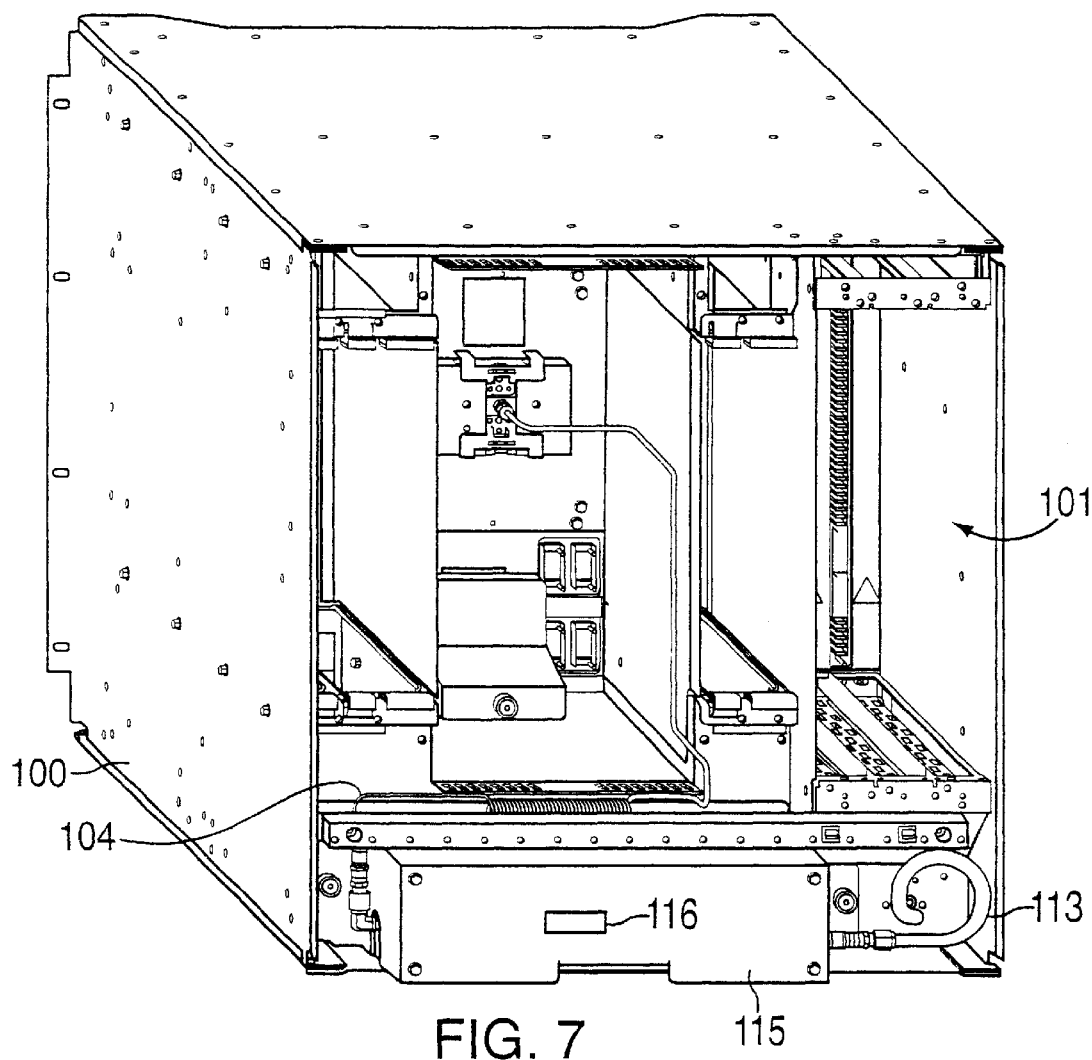
FIG. 7 is a perspective view of an exemplary processor cage.

Each refrigeration unit 20 includes a respective controller 24 in communication with a primary cage controller 60 and secondary cage controller 65, the latter being available in case of failure of primary cage controller 60, via two-way communication lines 64. Controller 24 operates in response to instructions from primary cage controller 60 or secondary cage controller 65 to cool logic module 50 to a desired temperature. In aid of this objective, controller 24 is equipped with various outputs and inputs to control refrigeration equipment 22 and to monitor the actual temperature of the evaporator. In addition to cooling logic module 50, controller 24 is responsible for preventing condensation within evaporator 30 and on circuit board 55 monitoring the temperature and relative humidity in the evaporator cavity (to be described in more detail below) and the temperature of heater 40, to ensure that it is greater than the dew point within the processor cage (FIGS. 6, 7).

Controller 24 controls refrigeration equipment 22 within refrigeration unit 20 via signal lines 23, and controls heat cartridge 44 via lines 29. Evaporator plate temperature is provided via lines 36 and evaporator cavity temperature and relative humidity are provided via lines 33 and 34, respectively. Finally, lines 42 provide heater temperature feedback.

Refrigeration units 20 are modular in nature, i.e., they are interchangeable and provide redundancy or backup capabilities to evaporator 30. Refrigerant lines 26 and refrigerant return lines 27 are connected to refrigeration unit 20 via respective quick-disconnect couplings 25 so that either refrigeration unit 20 may be quickly swapped out for maintenance or replacement once another refrigeration unit is on line. Refrigeration units 20 each include a condenser and compressor, as is known in the refrigeration art, and passes pressurized refrigerant, which may exist as a liquid, gas, or mixed-phase fluid to evaporator 30 via refrigerant lines 26. In a preferred embodiment, the compressor is a Maneurop LT-22 compressor, but any rotary, reciprocating, or scroll compressor of sufficient cooling capacity could be used. The precise refrigeration cycle and working fluid is determined based on a number of factors, such as the desired resultant temperature, environmental/regulatory considerations, desired coefficient of performance, desired size of condenser, cost, etc.

Figure 2:
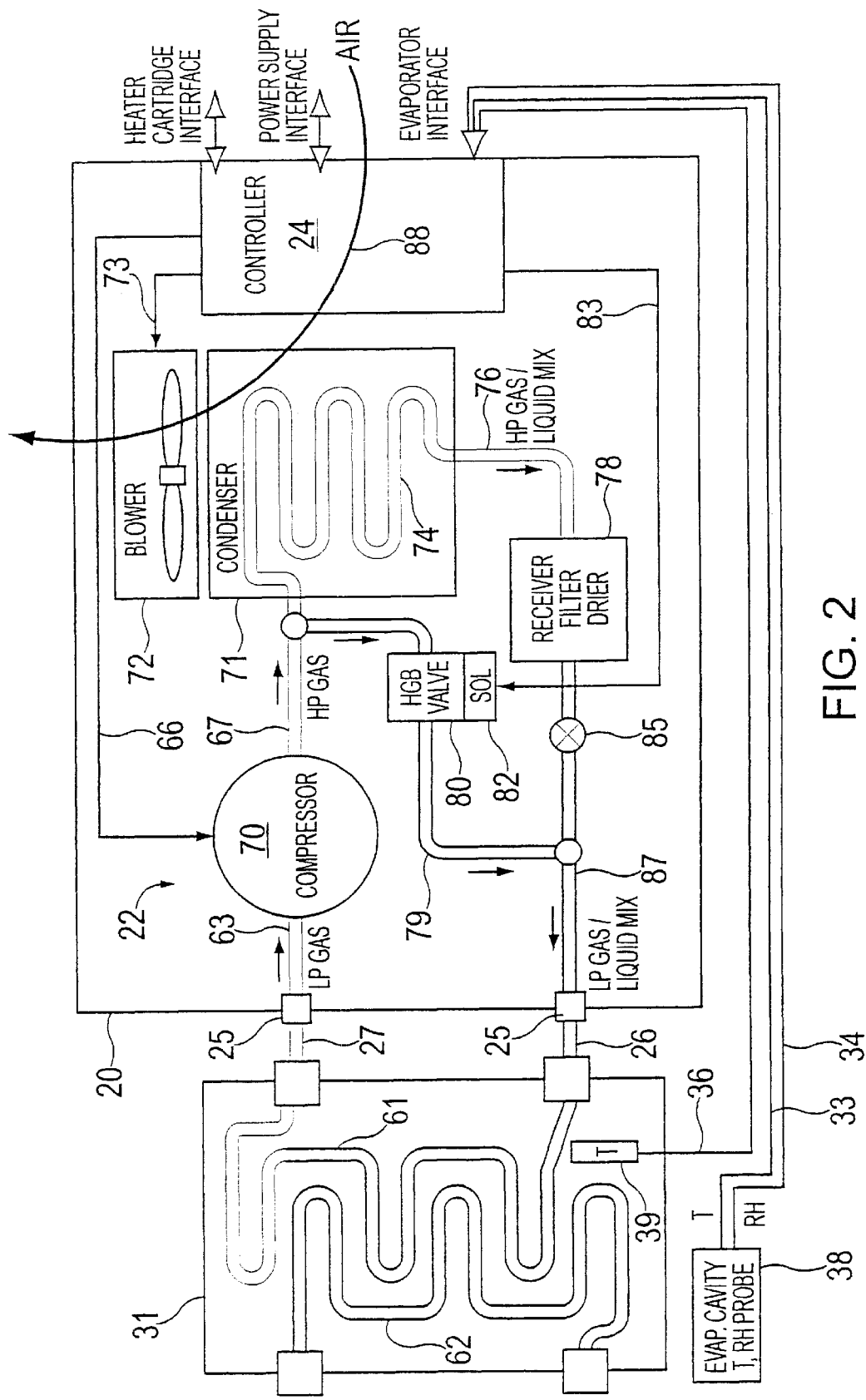
FIG. 2 is a schematic representation of an exemplary refrigeration unit and evaporator block.

Referring now to FIG. 2, an exemplary cooling cycle using R507 (AZ50) refrigerant provides temperatures as cold as −40° C. and colder. As would be appreciated by those skilled in the art, the target temperature may vary with the compression ratio and other factors, including various control measures as will be hereinafter described.

In the exemplary arrangement shown, a mixture of gas and liquid refrigerant are passed to evaporator block 31 via refrigerant line 26. Evaporator block 31 comprises copper, aluminum, or other heat conductive material and includes independent serpentine paths 61 and 62 formed therein. Serpentine paths 61 and 62 are circuitous pathways that may be formed by any known method, such as by cutting paths into a center layer that is then sealed between upper and lower layers of the material. Exemplary evaporator block structures are shown and described in commonly assigned U.S. Pat. No. 5,970,731 to Hare et al, issued Oct. 26, 1999 and U.S. Pat. No. 6,035,655 also to Hare et al., issued Mar. 14, 2000, both of which are herein incorporated by reference. Evaporator block 31 includes an additional serpentine path 62 for connection with a second refrigeration unit 20. Serpentine paths 61 and 62 are separated and are not in fluid communication with each other so that one refrigeration unit 20 may be disconnected while the other continues to operate. Evaporator block 31 is disposed in thermal communication with logic module 50 within evaporator 30 (FIGS. 1, 3) so that heat from logic module 50 is readily absorbed by refrigerant in serpentine paths 61 and 62.

Upon absorbing heat from logic module 50 (FIG. 1) the refrigerant vaporizes and is passed back to refrigeration unit 20 via refrigerant return line 27. This gaseous refrigerant is passed to compressor 70 via line 63, compressed therein, and then passed to condenser 71 via line 67, wherein it is condensed back into a liquid or mixed phase fluid. Blower 72 is driven by a variable A.C. motor or D.C. motor and pulls air through electronic controller 24 and condenser 71 in a path generally represented by arrow 88 for absorbing the heat from the refrigerant.

After being condensed in condenser 71, the coolant is received in filter/drier tank 78 via line 76, then passed to expansion valve 85 where a portion of the coolant is vaporized and its temperature is reduced. The coolant is then once again made available to evaporator 30 via line 87. A bypass line 79 is provided between lines 67 and 87 for bypassing the condenser and expansion valve in order to moderate the coolant's temperature. Bypass line 79 includes hot gas bypass valve 80, actuated by solenoid 82.

Controller 24 includes a processor and memory, as will be further described, for executing machine code to control the operation of refrigeration unit 20. Control unit 24 includes various inputs for temperature and humidity sensors in evaporator 30, to be described in more detail below, and outputs to control compressor 70, bypass valve 80, and blower 72 via lines 66, 83, and 73, respectively. Any of lines 66, 83, and 73 may carry control signals for actuating a relay or motor controller (not shown) which switches on and off power to the respective component, or such relay/motor controller may be internal to controller 24, and lines 66, 73, and 83 carry power to the respective components, in the known manner. The power supply and power lines are not illustrated for sake of clarity.

Additionally, refrigeration unit 20 includes outputs for controlling heat cartridge 44 (FIGS. 1, 3) and an input for receiving electrical power for supplying energy to controller 24, as well as compressor 51, blower 61, and solenoid 82.

Figure 3:
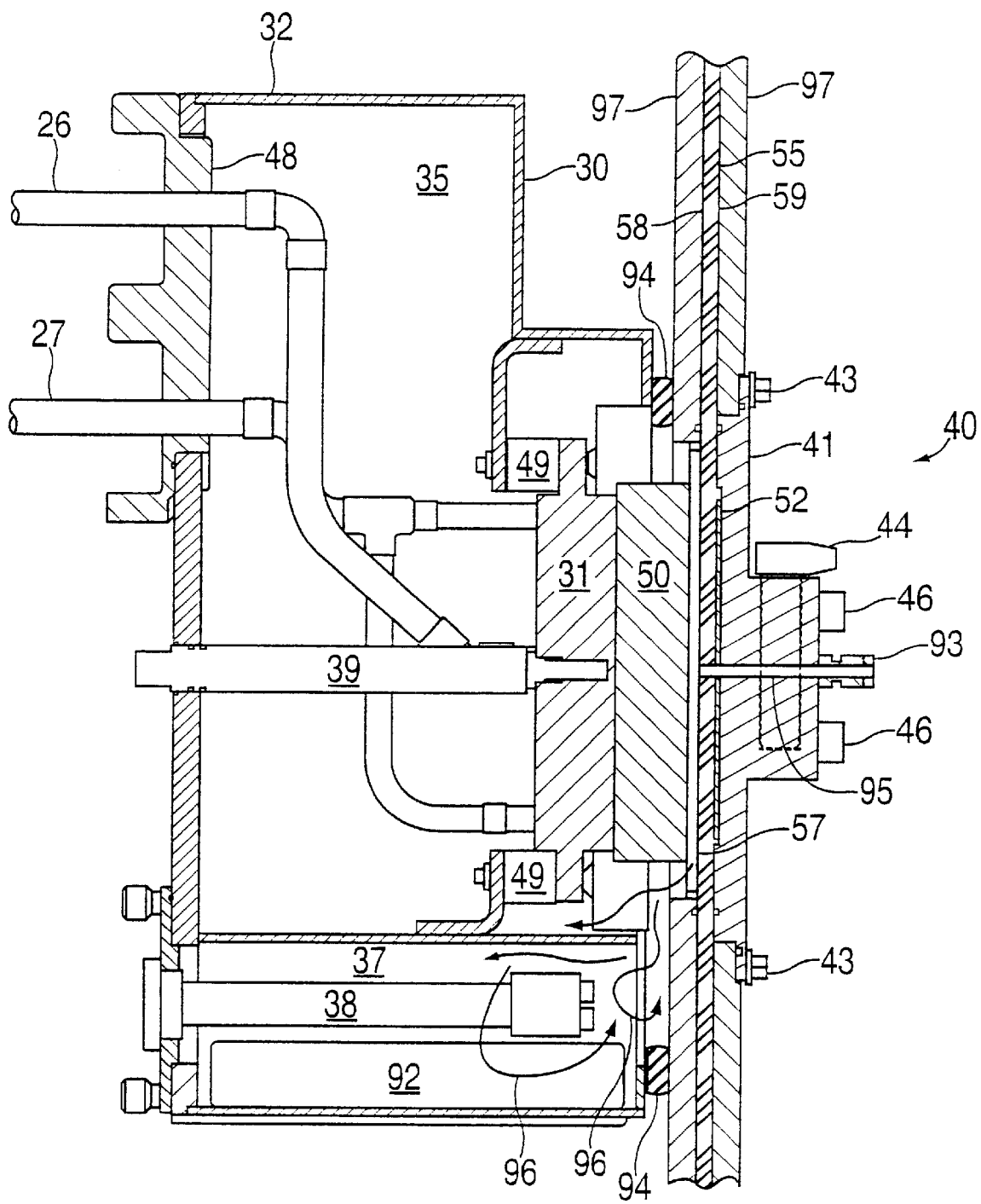
FIG. 3 is a cross-section view of an exemplary installed evaporator and heater.

FIG. 3 shows a cross section view of an exemplary implementation of an evaporator 30 and heater 40 assembled with a logic module 50 and circuit board 55. Circuit board 55 is provided with stiffeners 97 on either side to aid in supporting and attaching evaporator 30 and heater 40 to circuit board 55. Evaporator 30 is attached to a first side 58 of circuit board 55 and heater 40 is attached to a second side of circuit board 55 by screws 43 connected to stiffener 97 as shown. Refrigerant line 26 and refrigerant return line 27 supplies one of two serpentine paths 61 and 62 (FIG. 2). A second pair of refrigerant and refrigerant return lines lie directly behind lines 26 and 27 shown, allowing connection to an additional refrigeration unit 20, as described above.

Refrigerant line 26 and refrigerant return line 27 are connected to evaporator block 31 which is in thermal communication with logic module 50. Evaporator block and logic module 50 are sealed in an evaporator housing 32 by gasket 94. After assembly, Evaporator cavity 35 is filled with insulation, such as an injected polymer foam insulation, to reduce the amount of heat absorbed from evaporator housing 32, thus preventing the temperature of evaporator housing 32 from dropping below dew point. Grommet 48 is formed of insulating material and includes holes for passing refrigerant lines 26 and refrigerant return lines 27 into evaporator housing 32. Also extending into housing 32 is evaporator block temperature probe 39, which includes a sensor extending into evaporator block 31 for detecting the temperature of the evaporator block, and providing feedback information to refrigeration units 20 as previously described. Evaporator block temperature probe 39 preferably comprises dual thermistors for providing independent temperature detection for each of two refrigeration units 20. Evaporator housing 32 is attached to circuit board 55 in the known manner, with evaporator block 31 being biased against logic module 50 using biasing elements 49, which may comprise metal springs or elastomeric blocks.

Heater 40 comprises heat spreader plate 41 which includes accommodations for two heat cartridges 44 and dual temperature sensors 46 for detecting the temperature of heat spreader plate 41 and providing feedback to respective refrigeration units 20.

The internal atmosphere of evaporator 30 will be described with reference now to FIGS. 1 and 3. Desiccant canister 45 is connected at its inlet to a source of pressurized air. Dry air flows out of desiccant canister 45 through capillary tube 47 to heat spreader plate 41. Heat spreader plate 41 and circuit board 55 include an aligned through-hole 95 for conducting dry air from said capillary tube to the first side 58 of circuit board 55. Logic module 50 comprises a zero-insertion force connector as is known in the art which includes a small air space 57 (FIG. 3) between logic module 50 and circuit board 55. This arrangement raises the air pressure in evaporator housing 32 to slightly above ambient. Thus, any small amount of leakage or diffusion will only result in dry air infiltrating into evaporator housing 32.

Evaporator 30 also includes a desiccant slot 37 housing a desiccant bag 92 which absorbs any remaining moisture in evaporator cavity 35, such as might occur upon replacement or servicing of dual humidity and temperature sensor 38. Arrows 96 shows free movement of air between evaporator cavity 35 and desiccant slot 37. Desiccant slot 37 also houses dual humidity and temperature sensor 38, which includes redundant humidity and temperatures sensors. In a preferred embodiment, humidity and temperature sensor is or is similar to one available from Honeywell, part number HIH-3602-C and includes two independent humidity sensors and two independent thermistors. Capillary tube 47 is sufficiently long or otherwise includes an airflow resistor, such as an orifice, to prevent excessive air flow through capillary tube 47 in the case of a leak or while dual humidity and temperature sensor 38 is being serviced or replaced.

Figure 5:
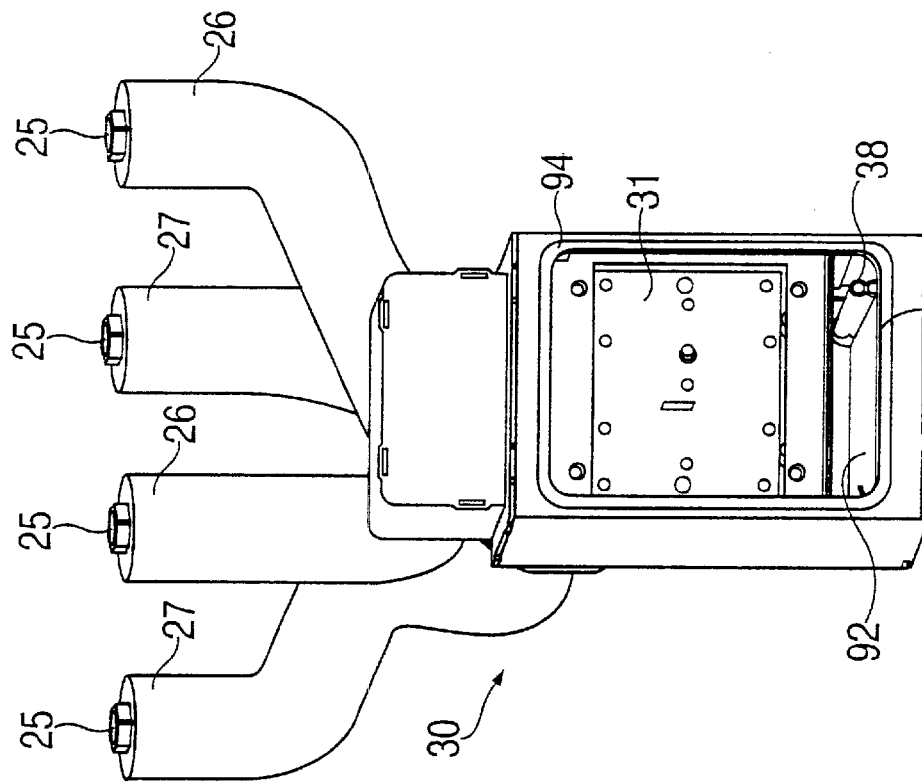
FIG. 5 is a rear perspective view of the evaporator of FIG. 3.
Figure 4:
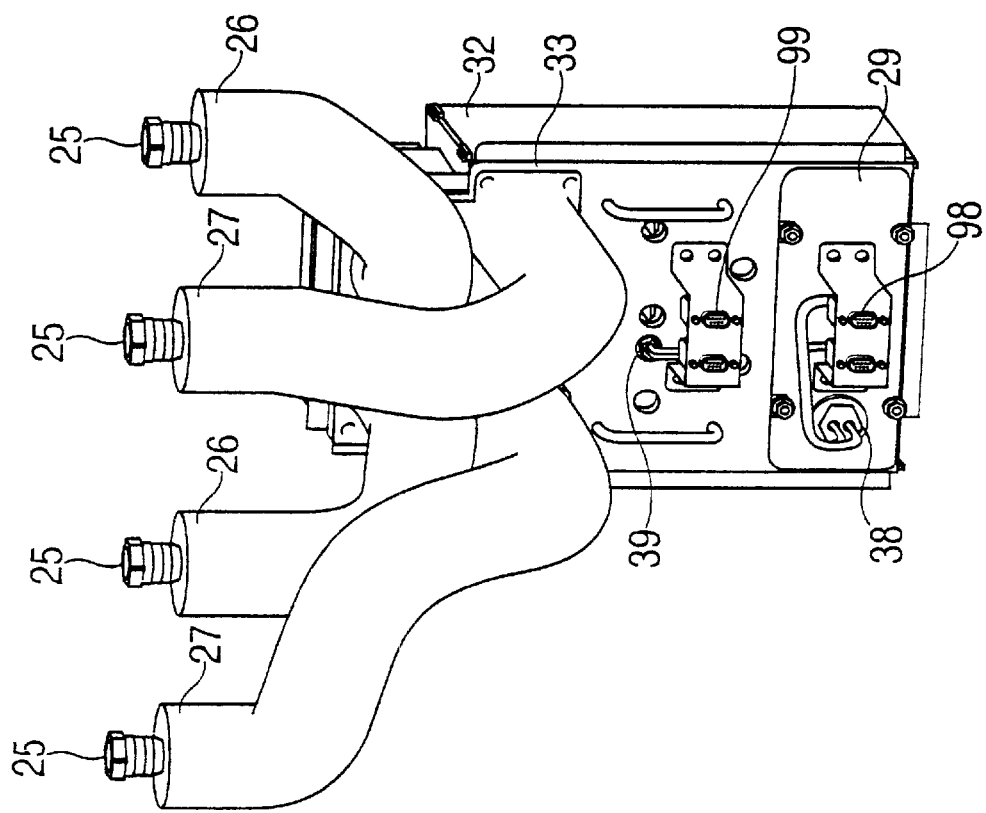
FIG. 4 is a front perspective view of the evaporator of FIG. 3.

FIGS. 4 and 5 show front and rear perspective views of evaporator 30, respectively. Refrigerant lines 26 and refrigerant return lines 27 are surrounded with thermal insulation to prevent condensation and loss of efficiency. Desiccant slot cover 28 (FIG. 4) encloses desiccant slot 37 and supports "D" connectors 98 which connect dual humidity and temperature sensor 38 to respective refrigeration units 20. Similarly, "D" connectors 99 are provided to connect evaporation block temperature sensor 39 to respective refrigeration units 20.

FIG. 6 shows a schematic representation of airflow management within processor cage 100. Air is drawn into processor cage 100 at air inlet 102. Air flows past memory books 105 and redundant power supplies (not shown) along path 103. Air is then forced though one of a plurality of blowers 110 (only one shown). Blower 110 includes louvers 11 which operate as check valves to prevent back flow through blower 110 when fewer than all blowers are operating. Air flows generally along path 107 by memory books 106 and along path 108 by heater 40. A majority of this air exits at exit 119, however some air flows through orifice 112 and then past evaporator 30 and then recirculates through one or more of blowers 110. In this manner, evaporator housing 32 is warmed by air previously warmed by absorbing heat from the power supply (not shown), memory books 105, 106, blowers 110, and heater 40. This warmed air passes heat energy to evaporator housing 32, thereby increasing its surface temperature to above dew point, ensuring that no condensation will form thereon.

FIG. 7 shows a perspective view of cage controller 100. A source of pressurized air supplies air through air hose 113 to desiccant canister 45 (FIG. 1) which resides in canister housing 115. A view-window 116 is provided so that an operator can see when the desiccant changes color, indicating saturation. Canister housing 115 outputs dry air to capillary tube 104 which is sufficiently long to restrict the air flow as previously described. Capillary tube 104 feeds into heat spreader plate 41 as shown. Cavity 101 receives modular redundant power supplies which provide power to logic module 50 (FIG. 1).

Figure 8:
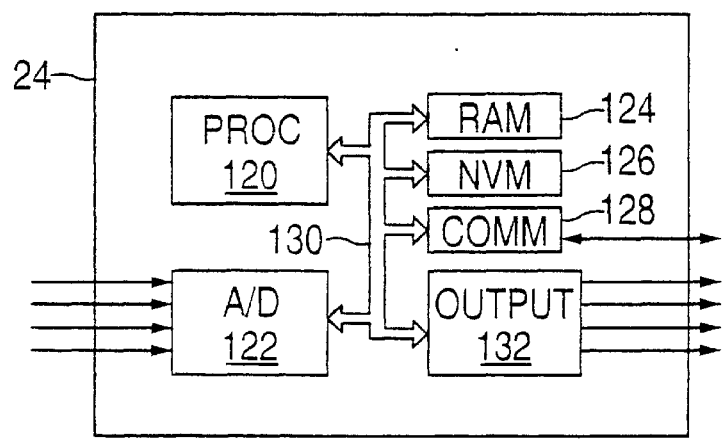
FIG. 8 schematically represents certain components of a refrigeration unit controller.

Referring to FIG. 8, each refrigeration unit controller 24 includes a processor 120, an analog-to-digital converter 122, random access memory 124, non-volatile memory 126, communication port 128, and output 132. Controller 24 also includes other necessary ancillary components such as power supply, clock, etc., which are not shown for sake of clarity. Non-volatile memory 126 may be any type of machine readable media such as ROM, PROM, EPROM, EEPROM, Flash, magnetic media, optical media, or other known type of non-volatile memory. Communications port 128 is preferably a standard serial port, as are generally known in the industry, such as the RS422 serial port. Each of these components are in communication with processor 120 via one or more data busses 130 (only one shown).

During operation of controller 24, software stored in non-volatile memory 126 causes processor 120 to perform various operations on input and to generate outputs accordingly. As shown in FIG. 1, controllers 24 are in communication with primary and secondary cage controllers 60 and 65. Additionally, cage controllers 60 and 65, which are also intelligent devices, are in communication with other controllers and sensors via Ethernet (see line 68 in FIG. 1) as generally known and understood in the art. Cage controllers 60 and 65 are responsible for monitoring and regulating the power supply, cooling fans, internal processor cage temperature, and other environmental aspects of the processor cage to ensure proper functioning of the system and the various internal components.

The use of an intelligent refrigeration unit controller allows the refrigeration unit to cooperate with the cage controller and larger system to maximize the performance of the logic module without sacrificing reliability. In this regard the controller can, in response to instructions from cage controller 60, precisely control the temperature of the evaporation block by controlling the speed of compressor 70 and by actuating hot gas bypass valve 80 (FIG. 2) in response to temperature readings from evaporator block temperature probe 39. The temperature to which the evaporator block is controlled may vary according to the current condition or operation of the logic module operating mode or power consumption, as well as the expected condition or operation of the logic module. In addition, the refrigeration unit controller is capable of reacting to component failures and notifying the cage controller of such failures. This provides improved reliability by allowing the cage controller to then switch to a second refrigeration unit and alert system administrators of the failure for repair or replacement of the defective component and/or refrigeration unit. Furthermore, by integrating the refrigeration unit with the cage controller, smooth transitions from one refrigeration unit to another can be easily achieved.

TABLE 1

| SYSTEM | RU 1 | RU 2 |
| --- | --- | --- |
| N mode | On | Off Deactivated |
| N+1 mode | On | Enabled |
| Switchover mode | Switchover-from | Switchover-to |

The system and the individual refrigeration units are capable of entering several different modes of operation to accomplish this task as summarized by Table 1. These modes will now be described with reference to an exemplary system capable of being connected to only two refrigeration units at any one time, though it should be understood that the system may be adapted to accommodate any number of refrigeration units. In the "N-mode," one refrigeration unit is on while the other refrigeration unit is either off or deactivated. When in the off-mode, the refrigeration unit is not operating to cool the logic module, but it is actively communicating with cage controller 60. When in the deactivated-mode, the refrigeration unit is off-line or disconnected. In the N+1 mode, the first refrigeration unit is on, while the second is "enabled". In the enabled mode, a refrigeration unit is not functioning to cool the logic module, and it is in communication with cage controller 60. What distinguishes "enabled" from "off" is that when enabled, the refrigeration unit is ready to step in and turn on, by itself and without instruction from the cage controller, if necessary. The conditions under which an enabled refrigeration unit may turn on by itself include sensing evaporator overtemperature and the cage controller didn't turn it on. A third mode of the system is the "switchover" mode. In a switchover mode, one refrigeration unit is designated the "switchover-from" unit, indicating that it is in a shut-down sequence, and one refrigeration unit is in a "switchover-to" mode, indicating that it is in a start-up sequence. The shutdown and startup sequences vary depending on whether the switchover-from unit is experiencing a fatal error or whether the switchover-from unit is running normally or experiencing only a minor error. A minor error is one that can be compensated, an example of which will be described below with reference to FIG. 11.

Each controller 24 makes status data available to the cage controller 60, and the cage controller 60 periodically transmits status data and instructions to the refrigeration unit controllers 24. This periodic data transmission is called "stuffage" and allows the refrigeration units to react to failures of the cage controllers, while the cage controllers' monitoring of refrigeration unit data allows them to react to failures of the refrigeration units in a logical manner. In the exemplary embodiment, refrigeration unit controller 24 sends posts the value of all the sensors of the refrigeration unit, particularly the evaporator and heater block temperatures, flags indicating the mode the refrigeration unit is currently in, and fault data, such as evaporator cavity over-humidity, heater block over-temperature, etc. This information is available to the cage controller to read. Every 7 seconds or so, the cage controller 60 stuffs the refrigeration unit with data including the current power of the logic module, ambient temperature, control commands such as turn on/off, prepare for power on, prepare for self test, enter enable mode, enter/exit switch-over-to mode, enter/exit switch-over-from mode, fault flags control commands to set or clear fault flags in the refrigeration unit controller.

During operation, cage controller 60 determines the set point for the refrigeration units. The set point is the desired temperature of evaporator block, and is dependent on the requirements of the logic module and the mode of operation and power draw of the logic module. For example, during start up operation, the set point is initially set to a high temperature of, e.g., 0° C. which may be designated a standby temperature. During self-test or periods of low current draw, the set point is set to an intermediate temperature to avoid condensation, e.g., −10° C. During normal operation, the set point is set to a low temperature, e.g., −20° C. It may be necessary to raise the set point during periods of low power dissipation in the logic module to ensure the surface temperature of the portion of the circuit board outside the sealed environment does not rise above the dew point.

FIG. 9 provides a flow chart diagram describing an exemplary start-up sequence. This represents code in refrigeration unit controller 24 and is particularly directed towards starting up the compressor without drawing excessive current from the power supply. The procedure begins at start block 152 and proceeds immediately to block 154 which instructs the hot gas bypass valve 80 (FIG. 2) to open to unload the compressor. Compressor 70 (FIG. 2) is driven to a relatively slow speed of about 2700 r.p.m. The hot gas bypass valve 80 is then pulsed by opening, closing, then opening again, to ensure that it is functioning properly. By employing pulse width modulation, the hot gas bypass valve is ramped to 100% closed at block 162. At about 81 seconds from start-up, the compressor speed is advanced to 50 Hz, which is equivalent to 3000 rpm at block 164. In block 166 PID (proportional, integral, derivative) control of the evaporator block temperature then begins at about 86 seconds after startup and the heater is powered to 60% on (e.g., using pulse width modulation with about 2 second cycle time). Block 168 begins thermal regulation and at block 170, the logic thread terminates.

The cage controller prepares for changes in logic state and sets the set point prior to the change, but not for so long as to create condensation. For example, in order for the logic module to function at optimum cycle time, it should already be chilled to its planned temperature condition. Therefore, the logic code must first request a low temperature state, then wait for the cage controller and refrigeration unit to provide that state, e.g., by changing the set point. Once the set point is achieved, the refrigeration unit sets a status bit for the cage controller to read, thus indicating that it has achieved status. The status bit may be indicative of an evaporator block temperature being within a selected range, e.g., 2° C. or 5° C., of the set point. Once the cage controller notices that the status bit is set, it gives permission to the logic code to operate at the faster cycle time. If the cage controller or refrigeration unit notices that the logic module failed to increase its cycle time within a selected time frame, e.g., anywhere from 20 seconds to 2 minutes, it will reset the set point to the high or medium temperature, to avoid condensation.

FIG. 10 represents code in cage controller 60 that is executed prior to "clocks-on" mode, i.e., prior to running logic module at its optimum speed. This procedure begins with block 172 and proceeds immediately to block 174 wherein one of refrigeration units 20 is turned on. The unit to be turned on may be selected at random, or otherwise. At block 176, the set point temperature T is initially set to high, which may correspond to 0° C. At block 178, cage controller 60 then waits for the status bit in refrigeration unit 20 as described above. If all is well, cage controller 60 sets the set point to a medium value, e.g., −10° C. as block 180 provides. At block 182, cage controller 60 then waits once again for the status bit in refrigeration unit 20. At block 184, with the logic module cooled to its intermediate value, cage controller 60 signals higher-level code to commence its self test. This step may be skipped at the user's option. If all is well, cage controller continues to block 186 where the set point is finally set to the low temperature, e.g., −20° C. At block 188, cage controller 60 again waits for the status bit. Then, at block 190, cage controller gives the higher-level code the go-ahead for clocks-on, and the procedure terminates at block 192. If clocks-on fails to commence within a selected time-frame, e.g., 2 minutes, then the set point is returned to the intermediate value to prevent over-cooling of the circuit board.

Each refrigeration unit controller 24 monitors its individual humidity sensor or its independent output of dual humidity and temperature sensor 38 to ensure that it remains within normal limits. If the sensor output is outside the normal limits of the sensor probe, controller 24 sets an error flag indicating that the sensor is "insane". Higher level system code monitors the error flags from refrigerator unit 20. Upon detecting the error, the higher level system code will message a system operator that the humidity sensor needs to be replaced, as described below.

Sometimes, a humidity sensor will slowly drift from the correct reading, rather than returning an insane value. To detect a faulty sensor that is merely inaccurate, rather than insane, cage controller 60 compares the actual sensor values together when one of refrigeration units 20 indicates an over humidity condition. If the difference between the readings is beyond a miscompare limit, e.g., 5% relative humidity, the higher-reading humidity sensor is flagged as defective and the operator is requested to replace the dual humidity and temperature sensor 38. If the difference between the readings is within the miscompare limit, then a dry air breach warning is surfaced and a repair is requested of this condition. In an alternate embodiment, dual humidity and temperature sensor 38 is replaced with a pressure sensor. This would protect against failures of the seal around evaporator cavity 35, but would not insure against moisture diffusion through the various elastomeric membranes.

It should be noted that the output of the thermistors in dual humidity and temperature sensor 38 are used to correct the sensed relative humidity value for evaporator cavity 35 in accordance with the manufacturer's specifications. It is this temperature-corrected relative humidity value that is used for fault detection and isolation. The correction is required since the local air temperature around dual humidity and temperature sensor 38 varies with ambient as well as with the temperature set point in evaporator 30.

Concurrent maintenance, i.e., maintenance during continued operation of the logic module, of the dual humidity and temperature sensor 38 (humidity sensor) is accomplished by deactivating the humidity sensor. In this case, "deactivating" the humidity sensor means causing heat cartridge 44 to thermostatically control the board temperature to a higher than normal value to prevent moisture from forming thereon when evaporator cavity 35 is opened for the short time needed to replace humidity sensor 38. Refrigeration unit controller 24 sets a timer when the humidity sensor is deactivated and gives a warning signal if the repair procedure takes too long. For example, if the evaporator cavity is opened for more than 10 minutes, an audible alarm is produced, or a warning message is sent to cage controller 60. If the amount of dry air supplied from desiccant canister 45 is increased while evaporator cavity 35 is opened, then this time may be increased. For example, capillary tube 47 may be replaced with a pair of differently-sized orifices, with a valve and actuating mechanism, to allow increased air flow while the humidity sensor is being serviced.

While dual humidity and temperature sensor 38 is being replaced, the internal desiccant bag is also replaced so that any moisture that enters evaporator cavity 35 during this procedure is removed. Once dual humidity and temperature sensor 38 is replaced, it is "activated" and the heaters are returned to normal power. Refrigeration unit 20 then resumes normal monitoring of the relative humidity levels in evaporator cavity 35.

Temperature sensors 46 are monitored for sanity in a manner similar to the way the humidity sensors are monitored. For example, if the heaters are more than 10° C. apart in their temperature measurements, a miscompare fault flag is set, and one or both sensors are replaced.

Outputs of temperature sensors 46 are also compared with over and under temperature limits. These limits are a function of other system states or environmental conditions. A temperature outside the range defined by the over and under limits, could indicate a faulty heater, connection, or drive circuit. A defect in the running refrigeration unit triggers a switchover to the other (good) refrigeration unit. The defective heat cartridge and thermistor is concurrently replaced by first deactivating the heater, causing the good running refrigeration unit to thermostatically control the heater to a lower, touchable temperature. As with the humidity sensor, a timer is set as a result of the heater deactivating command. Sufficient time is allotted for replacing heat cartridge 44 and thermistor 46, but not so much time as to permit moisture to form on critical surfaces. For example, the timer may be set for 10 minutes, after which an alarm sounds.

Each refrigeration unit 20 controls its own heat cartridge 44, and the heat value is controlled from no heat to full heat, up to 300 W, if heat cartridge 44 is a 300 W heater. Heat cartridge 44 is controlled-by pulse width modulation at a frequency fast enough compared to the thermal mass of heat cartridge 44 that prevents temperature cycling and related heater failure, e.g., 2 Hz has been found to be a sufficiently fast frequency. Unique heat values are used for particular power and environmental states. In a method described by FIG. 11, the heater power is reduced for high ambient air temperature conditions. Ambient temperature is measured within the refrigeration unit enclosure at the inlet to condenser 71 (FIG. 2) using a thermistor. This thermistor is tested for sanity in the same manner as temperature sensor 46 described above. Starting with block 194 refrigeration unit controller 24 proceeds immediately to block 196 and determines whether the thermistor at the inlet of condenser 71 is insane. If not, controller 24 proceeds to block 198 wherein the condenser inlet temperature is taken as the ambient temperature, and controller 24 proceeds to block 202. If the thermistor is insane, then the ambient temperature is set to the ambient temperature from a thermistor mounted on the system frame, which is provided in stuffage from cage controller 60. A compensation value is added to this value since the frame temperature will typically be several degrees cooler than the air entering condenser 71, due to the environment in refrigeration unit 20. Controller 24 then proceeds to block 202.

At block 202, controller 24 tests whether the ambient temperature is less than 30° C. If so, heat cartridge 44 is set to 60% of maximum and blower 72 (FIG. 2) is set to 2,000 rpm. Then, the procedure terminates at block 208. If the ambient temperature is greater than 30° C., the heat cartridge is set to only 30% of maximum and the blower is set to 2,800 rpm, to compensate for warmer ambient air.

Switchover from one refrigeration unit 20 to another refrigeration unit 20 can occur on a scheduled basis, for example, every 160 hours. In addition, switchover can be for recovery purposes, i.e., when one refrigeration unit is faulty. In particular, a recovery switchover may be in response to such failures as double communications fault to the on refrigeration unit, temperature sensor 46 insane, over temperature, or under temperature, or dual humidity and temperature sensor insane or over humidity. A double communication fault occurs when both cage controller 60 and secondary cage controller 65 lose communication with the on refrigeration unit.

In a switch-over mode, cage controller 60 posts switching-from and switching-to bits in stuffage to respective refrigeration units 20, then posts a "switchover" function bit. The switching-from refrigeration unit compressor is set to maximum speed and its hot gas bypass valve is closed (0%) to prepare for turning on the switching-to refrigeration unit. After a short pause, the switching-to refrigeration unit is turned on, causing significant heat to be passed to evaporator block 31 during startup. The switching-to unit set point is then set a small amount lower (e.g., 1° C.) than the set point of the switching-from refrigeration unit, causing the switching-to unit to be taxed to a greater extent as the switching-from unit dumps heat through its hot gas bypass valve in an effort to bring the temperature up to its set point. Switching-to and switching-from refrigeration units are designed to be capable of maintaining this "switch-over" mode indefinitely. However, the switching-from refrigeration unit is kept on for a selected period of time, e.g., 4 minutes. The switching-from refrigeration unit is then turned off only after the switching-to unit exhibits no fault or warning conditions. After good status, the cage controller shuts down the switching-from refrigeration unit, and places it in enabled mode, then clears the switchover mode and function bit.

In the case of a recovery switchover, there is no pause in bringing the switching-to refrigeration unit to the set point temperature, and once achieved, the switching from refrigeration unit is immediately shut down.

When a system is powered off after the logic module has been chilled to below zero, there is a danger that condensation will form when the evaporator is removed to service the logic module. To prevent such condensation from forming, cage controller 60 sends the running refrigeration unit 20 a "prepare-for-power-off" command, causing it to open its hot gas bypass valve 80, causing high enthalpy refrigerant to pass directly into the evaporator and thus rapidly heating the evaporator, as well as the logic module it is attached to. To further accelerate the heating of the chilled logic unit and circuit board, heat cartridge 44 is left on. These steps enable logic module 50 to be serviced in an acceptable timeframe without danger of condensation being formed on the vulnerable areas.

While the invention has been described with reference to specific embodiments thereof, it is intended that all matter contained in the above description and shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention as defined in the appended claims.

We claim:

1. A method for starting a refrigeration unit for a logic module, said refrigeration unit having a first refrigerant path placing an evaporator and a compressor in fluid communication, a second refrigerant path placing the compressor and condenser in fluid communication, a third refrigerant path placing the condenser and an expansion valve in fluid communication, a fourth refrigerant path placing the expansion valve and the evaporator in fluid communication, and a bypass path having a hot gas bypass valve, said bypass path extending between said second refrigerant path and said fourth refrigerant path, said method comprising:

opening said hot gas bypass valve;

setting said compressor to run at an initial low speed;

ramping said hot gas bypass valve to a closed position; and increasing the speed of said compressor to a speed greater than said initial low speed.

2. The method of claim 1 wherein said ramping is performed using pulse width modulation.

3. The method of claim 1 further comprising pulsing said hot gas bypass valve closed prior to said setting.

4. The method of claim 1, further comprising:

initiating closed loop temperature control of said evaporator and after said increasing.

5. The method of claim 1, further comprising:

controlling a heater to a selected power level after said increasing, said heater preventing condensation on a circuit board upon which said logic module is mounted.

* * * * *